United States Patent [19]

Nishimura

[11] Patent Number: 4,718,424
[45] Date of Patent: Jan. 12, 1988

[54] NMR IMAGING OF BLOOD FLOW BY MOMENT VARIATION OF MAGNETIC GRADIENTS

[75] Inventor: Dwight G. Nishimura, Palo Alto, Calif.

[73] Assignee: Stanford University, Stanford, Calif.

[21] Appl. No.: 894,318

[22] Filed: Aug. 7, 1986

[51] Int. Cl.$^4$ .............................................. A61B 5/05
[52] U.S. Cl. .................................. 128/653; 324/306; 324/309
[58] Field of Search ................. 128/653; 324/306, 309

[56] References Cited

U.S. PATENT DOCUMENTS

| | | | |
|---|---|---|---|
| 4,443,760 | 4/1984 | Edelstein et al. | 324/309 |
| 4,528,985 | 7/1985 | Macovski | 128/653 |
| 4,595,879 | 6/1986 | Lent et al. | 324/309 |
| 4,609,872 | 9/1986 | O'Donnell | 324/306 |
| 4,616,180 | 10/1986 | Compton | 324/309 |

*Primary Examiner*—Kyle L. Howell
*Assistant Examiner*—Ruth S. Smith
*Attorney, Agent, or Firm*—Flehr, Hohbach, Test, Albritton & Herbert

[57] ABSTRACT

Selective material projection imaging in which static and flowing material are distinguishable utilizes magnetic gradients whose waveforms have selective moments. The effects of the magnetic field gradients are utilized in obtaining data for a plurality of images whereby the subtraction of image data will result in selected material imaging. The zero moment of a magnetic gradient waveform affects the phase of static material and the phase of moving material, while the first moment of a magnetic gradient waveform affects the phase of constant velocity moving material but not the phase of static material. The second moment of a magnetic gradient waveform affects the phase of varying velocity moving material but not the phase of static material or constant velocity material. The nuclear spins of a region of a body can be excited under different conditions of an applied magnetic field gradient so that data under the different conditions can be subtracted to eliminate selected material. Alternatively, the two magnetic field gradient can be applied during the preparatory periods or the read-out periods in obtaining the data for the two images.

16 Claims, 25 Drawing Figures

NMR IMAGING OF BLOOD FLOW BY MOMENT VARIATION OF MAGNETIC GRADIENTS

The U.S. government has rights in the claimed invention pursuant to NIH Contract HV-38045 and Grant HL-34962.

BACKGROUND OF THE INVENTION

This invention relates generally to nuclear magnetic resonance (NMR) or magnetic resonance (MR) imaging, and more particularly the invention relates to the selective projection imaging of moving material by magnetic gradient manipulation.

Techniques are known for magnetic resonance angiography in which blood flow is imaged. U.S. Pat. No. 4,528,985 utilizes a temporal subtraction technique in which image data at two different time intervals is obtained and substracted so that data for static material cancels and data for moving material (e.g., blood) provides a residual image.

U.S. Pat. No. 4,516,582 excites nuclear spins in a thin slab and employs a gradient field to dephase excited spins of static material. After a time interval in which excited nuclear spins of blood flow from the thin slab, the nuclear spins and the slabs are again excited. Due to the dephasing of the static spins, substantially all of the subsequent resulting NMR signal will come from the excitation of spins of blood flow which moves into the slab during the time interval.

Application Ser. No. 663,542 filed Oct. 22, 1984 for FLOW MEASUREMENT USING NUCLEAR MAGNETIC RESONANCE now U.S. Pat. No. 4,647,857 utilizes spin echo techniques to eliminate the effects of static nuclear spins whereby a residual signal from dynamic or moving nuclear spins is obtained.

SUMMARY OF THE INVENTION

An object of the present invention is an improved method and apparatus of NMR imaging of moving material using selective spin excitation.

Another object of the invention is a method of differentiating static material, moving material at a constant velocity, and moving material at a varying velocity.

A feature of the invention is the use of magnetic gradient waveforms having different moments during excitation of nuclear spins or detection of nuclear spin signals.

Briefly, the effects of magnetic field gradients are utilized in obtaining data for a plurality of images whereby the subtraction of imaged data will result in selective material imaging. More particularly, the zero moment of a magnetic gradient waveform affects the phase of static material and moving material, and the first moment of a magnetic gradient waveform affects the phase of constant velocity moving material but not static material. The second moment of a magnetic gradient waveform affects the phase of varying velocity moving material but not the phase of static material or the phase of constant velocity material.

Accordingly, the nuclear spins of a slice of a body are excited under different conditions of an applied magnetic field gradient so that data under the different conditions can be subtracted to eliminate selected material, either static or moving.

The invention and objects and features thereof will be more readily apparent from the following detailed description and dependent claims when taken with the drawing.

DETAILED DESCRIPTION OF ILLUSTRATIVE EMBODIMENTS

Figure 1A:
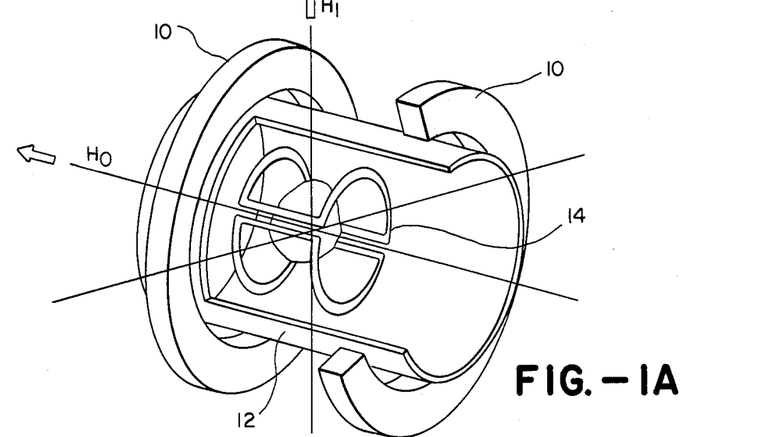
FIGS. 1A–1D illustrate the arrangement of NMR apparatus and magnetic fields generated therein.
Figure 1B:
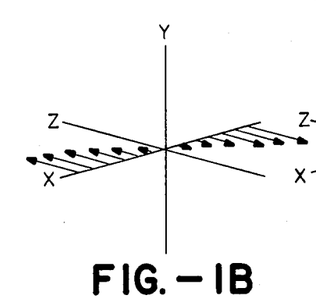
Figure 1C:
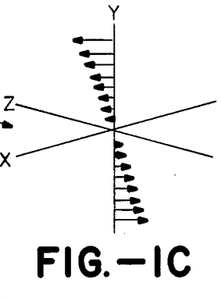
Figure 1D:
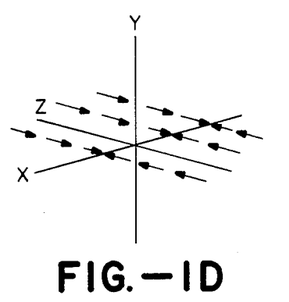

Referring now to the drawings, FIG. 1A is a perspective view partially in section illustrating coil apparatus in NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation", *Proceedings of the IEEE*, vol. 71, No. 3, March 1983 pgs. 338–350.

Briefly, the uniform static field $H_o$ is generated by the magnetic comprising the coil pair 10. A gradient field G(x) is generated by a complex gradient coil set which can be wound on the cylinder 12. An RF field $H_1$ is generated by a saddle coil 14. A patient undergoing imaging would be positioned along the Z axis within the saddle coil 14.

In FIG. 1B an X gradient field is shown which is parallel to the static field $H_o$ and varies linearly with distance along the X axis but does not vary with distance along the Y or Z axes. FIGS. 1C and 1D are similar representations of the Y gradient and Z gradient fields, respectively.

Figure 2:
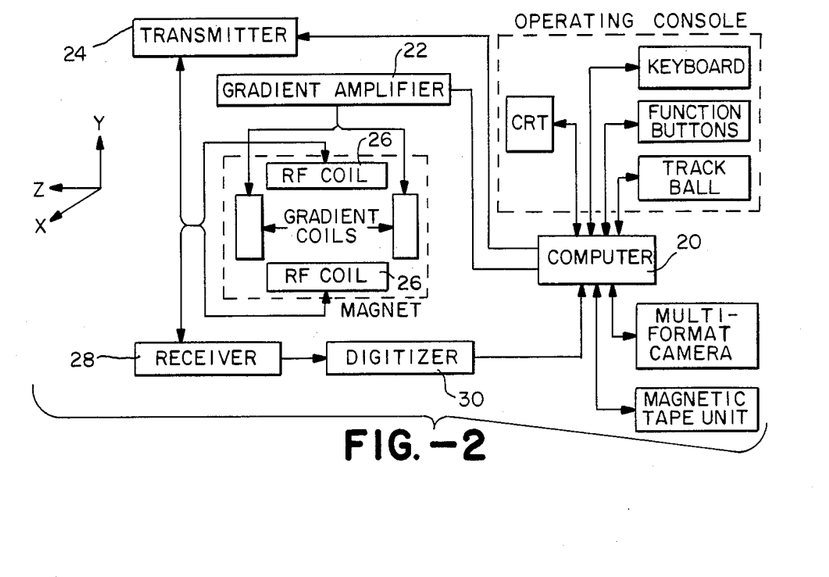
FIG. 2 is a functional block diagram of NMR imaging apparatus.

FIG. 2 is a functional block diagram of the imaging apparatus as disclosed in *NMR—A Perspective on Imaging*, General Electric Company 1982, A computer 20 is programmed to control the operation of the NMR apparatus and process FID signals detected therefrom. The gradient field is energized by a gradient amplifier 22, and the RF coils for impressing a RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

In accordance with the present invention waveforms of multiple magnetic gradients having selective magnetic moments are employed during the excitation of nuclear spins or during signal detection to achieve improved NMR imaging of moving material. For signal detection, the waveform of the magnetic gradient up to the center of the detected signal determines the first moment value. The effects of magnetic field gradients are utilized in obtaining data for a plurality of images whereby the subtraction of image data will result in selective material imaging. More particularly, the zero moment of a magnetic gradient waveform affects the phase of static material and moving material having a velocity component in the direction of the gradient, while the first moment of a magnetic gradient waveform affects the phase of continuous velocity moving material but not static material. The second moment of a magnetic gradient affects the phase of varying velocity moving material but not the phase of static material or constant velocity material. Before describing in detail several embodiments of the invention, the effects of magnetic field gradients on flowing material will be briefly reviewed.

EFFECTS OF MAGNETIC FIELD GRADIENTS ON FLOWING MATERIAL

In MR imaging, the received signal S(t) after quadrature detection can be expressed as (ignoring relaxation)

$$S(t) = \int_r \rho(\bar{r}) e^{-i\phi(\bar{r},t)} d\bar{r}, \quad (1)$$

where $\rho(\bar{r})$ is the spin density as a function of spatial position $\bar{r}$ at some reference time. In general, for a time-varying Gradient $\bar{G}(t)$, the phase $\phi(\bar{r},t)$ of an isochromat with positional time-dependence $\bar{r}(t)$ is $$\phi(\bar{r},t) = \gamma \int_{t_1}^{t_1 + t} \bar{G}(t) \cdot \bar{r}(t) \, dt. \quad (2)$$

As will be discussed, flow sensitivity can be achieved by proper manipulation of the gradients in ways that create velocity-dependent phase modulations.

The simplest situation to consider is material flowing at a constant velocity v in the direction of a constant x-gradient. Hence, $r(t)=(x+vt)x$, $G(t)=Gx$ (x the unit vector in the x-direction), and assuming $t_1=0$, $$\phi(t) = \gamma \int_0^t G(x + vt)dt = \gamma Gxt + \gamma Gv\frac{t^2}{2}. \quad (3)$$

Generally stated, the phase of static material depends on the area (zero moment) of the gradient waveform G(t) while the phase of constant velocity material depends also on the first moment of G(t). Hence the condition to remove phase dependence on x is $$\int_0^t G(t)dt = 0, \quad (4)$$

and the similar condition to remove phase dependence on v is $$\int_0^t G(t) \, t \, dt = 0, \quad (5)$$

Figures 3A, 3B, 4A:
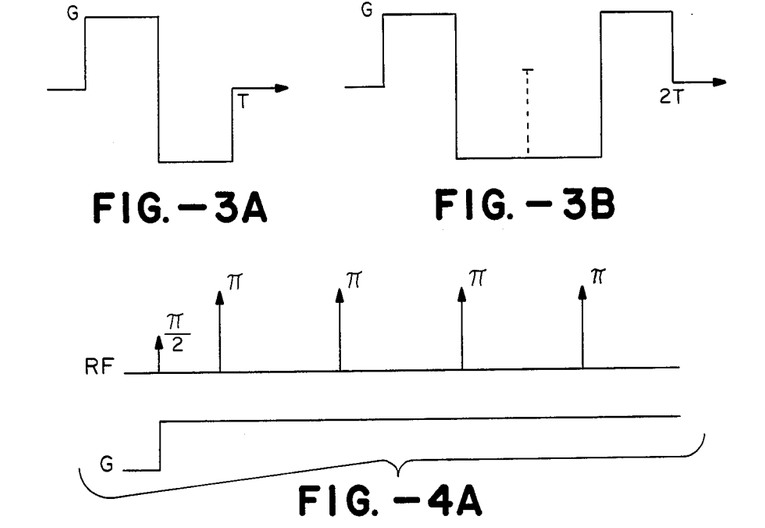
FIG. 3A illustrates a symmetric bipolar gradient waveform that leads to velocity phase encoding.
FIG. 3B illustrates back-to-back symmetric bipolar gradient waveforms of opposite polarity that removes velocity phase encoding.
FIG. 4A illustrates multiple spin echo sequence with equally spaced 180° pulses in the presence of a constant gradient.

A useful gradient waveform is that shown in FIG. 3A, a single period of a squarewave. This pulsed bipolar (or biphasic) gradient results at time T in the well-known phase expression $$\phi(T) = \gamma \int_0^{T/2} G(x + vt)dt - \gamma \int_{T/2}^T G(x + vt)dt = \quad (6)$$

$$-\gamma Gv\frac{T^2}{4},$$

linearly-dependent on v and, because the waveform area is zero, independent of x. This gradient thus provides a simple yet powerful means of velocity phase-encoding, which can become the basis for distinguishing flowing material from stationary material.

Similar to rephasing static material by reversing the gradient, the velocity-dependent phase shift set-up by the initial bipolar gradient can be exactly cancelled by applying a second bipolar gradient, of reversed polarity to that of the first (FIG. 3B). The resultant phase is $$\phi(2T) = -\gamma Gv\frac{T^2}{4} - \gamma \int_T^{3T/2} G(x + vt)dt + \quad (7)$$

$$\gamma \int_{3T/2}^{2T} G(x + vt)dt = -\gamma Gv\frac{T^2}{4} + \gamma Gv\frac{T^2}{4} = 0.$$

Figure 4B:
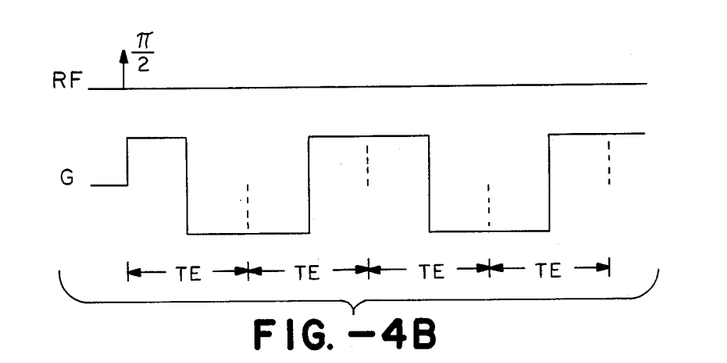
FIG. 4B illustrates the sequence without 180° pulses that gives similar phase history.

This gradient waveform therefore makes phase insensitive to both spatial position and velocity although it does provide sensitivity to higher order motion such as acceleration. Velocity-rephasing via opposite bipolar gradient pulses explains the even-echo rephasing phenomenon in which spins subjected to a train of 180° ($\pi$) pulses while flowing in the direction of a constant gradient (FIG. 4A) are rephased on each even echo. Because the phase of the echo produced by a gradient after a 180° pulse is the same as that produced by a reversed gradient without the 180° pulse, the train of 180° excitations with a constant gradient amounts effectively to switching the gradient polarity back and forth without the 180° pulses (FIG. 4B). The repeated switching of gradient polarities leads to a waveform that takes the form of opposing bipolar gradients at the even echo locations, at which points velocity rephasing occurs.

The above results can be analyzed in a more general fashion. For a general bipolar gradient (FIG. 5), the phase expression is $$\phi(T) = \gamma G \times T[B + A - AB] + \gamma G v \frac{T^2}{2} [B^2 + A - AB^2]. \quad (8)$$

Figure 5:
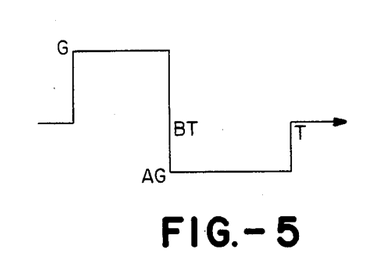
FIG. 5 illustrates a bipolar gradient waveform with general amplitudes and transition.

The velocity-dependent result of equation (6) derived for the symmetric bipolar gradient case is obtained by setting $A = -1$ and $B + A - AB = 0$. However, it is also possible to render the phase independent of velocity but maintain positional dependence. For velocity independence, the condition is $$B^2 + A - AB^2 = 0, \quad (9)$$

which implies $$A = \frac{B^2}{B^2 - 1} \quad (10)$$

and results in $$\phi(T) = \gamma G \times T \frac{B}{B + 1}. \quad (11)$$

If $A = -1$, then $$B = \frac{\sqrt{2}}{2}$$

and $$\phi(T) = \gamma G x T(\sqrt{2} - 1). \quad (12)$$

Figure 6:
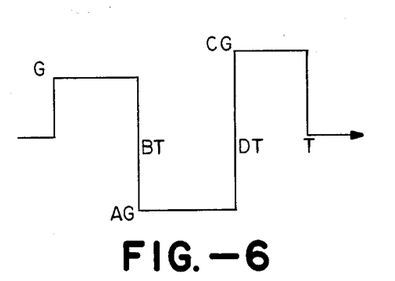
FIG. 6 illustrates a triple segment magnetic gradient waveform with general amplitudes and transitions.

For a generalized triple-segment gradient waveform as given by FIG. 6, phase dependence on any combination of two parameters chosen from x-position, velocity, and acceleration can be eliminated. Including acceleration a, the phase expression becomes $$\phi(T) = \gamma \int_0^T G(t)(x + vt + \tfrac{1}{2}at^2)\, dt, \quad (13)$$

$$= \gamma G x T[B + AD - AB + C - CD] +$$

$$\gamma G v \frac{T^2}{2}[B^2 + AD^2 - AB^2 + C - CD^2] +$$

$$\gamma G a \frac{T^3}{6}[B^3 + AD^3 - AB^3 + C - CD^3].$$

It can be shown that to remove both x and v dependence, and setting $A = -1$ and $C = 1$ to keep the gradient magnitude constant, the conditions $B = 0.25$ and $D = 0.75$ must hold, corresponding exactly to the opposing back-to-back bipolar waveform as was previously mentioned. To remove both v and a dependence, and again setting $A = -1$ and $C = 1$, it can be shown that $B \approx 0.45$ and $D \approx 0.84$.

Figure 7:
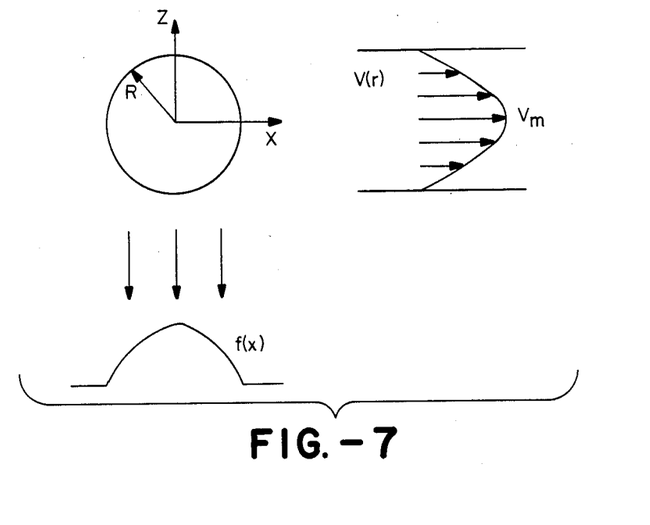
FIG. 7 illustrates a one dimensional projection profile f(x) representing line integrals taken across the lumen of a vessel with circular cross-section of radius R and with a laminar velocity distribution of maximum velocity $V_m$.
Figure 8A:
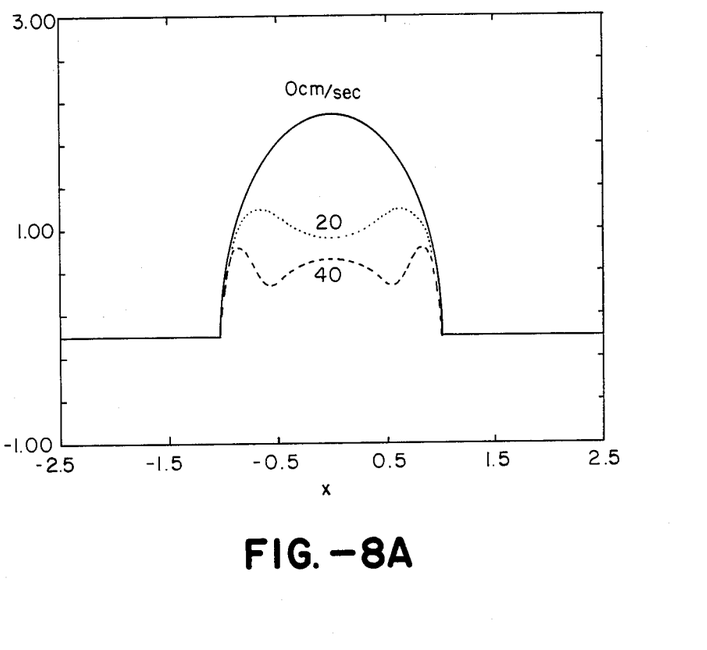
FIG. 8A illustrates a computed projection profile of a vessel based on signals set up by a symmetric bipolar magnetic gradient with amplitude G and duration T.
Figure 8B:
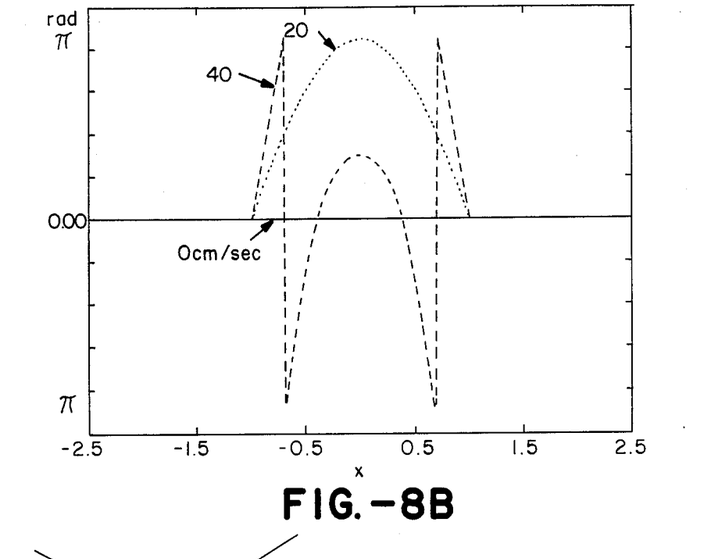
FIG. 8B illustrates a one dimensional projection profile as a function of velocity $V_m$.

Given the equation for $\phi$, the resultant signal S(t) can be determined by evaluating equation (1). The expression simplifies considerably for the case of uniform or "plug" flow, and examination of the phase expression by itself often suffices to predict the signal in the resultant image. However, in the case of laminar flow, the presence of a parabolic velocity profile across the vessel lumen influences the resultant signal and image in a more complicated way. Whenever phase depends on velocity, a wide distribution of velocities can lead to significant phase cancellations, an effect which in part accounts for the so-called "flow-void" phenomenon occurring when a large velocity gradient exists over a pixel. Because each pixel in a projection image represents the line integral through the vessel lumen, the existence of significant phase variations over the lumen can lead to a significantly reduced signal due to destructive interference. Assuming a laminar flow distribution with peak velocity $v_m$ and a bipolar gradient as in FIG. 3A applied in the direction of flow, the transverse projection profile f(x) of a vessel with circular cross-section of radius R (FIG. 7) is $$f(x) = \int_{z=-\sqrt{R^2-x^2}}^{\sqrt{R^2-x^2}} \rho(x,z) e^{-i\gamma G v(r) \frac{T^2}{4}} dz \text{ for } |x| < R \quad (14)$$

$$= 2e^{-i\frac{\pi}{2}A(R^2-X^2)} \frac{1}{\sqrt{A}} \{C(\sqrt{A}\,(R^2 - x^2)) +$$

$$iS(\sqrt{A}\,(R^2 - x^2))\}$$

where $$A = \frac{\gamma G v_m \frac{T^2}{4} \frac{1}{R^2}}{\frac{\pi}{2}},$$

and C(x) and S(x) are standard cosine and sine Fresnel integrals respectively. FIG. 8A shows the progressive diminution of the projection magnitude $|f(x)|$ with $v_m$, and FIG. 8B plots the progression of phase of the projections. Although the peak amplitude decays asymptotically as $1/\sqrt{v_m}$ with infinitesimally small pixel widths, the decay is more pronounced given the finite pixel width which effectively integrates over a phase variation that grows wider with increasing $v_m$. Conceptually, the above results apply even in the presence of nonlaminar flow distributions as long as a velocity gradient exists over the vessel lumen to create sufficient phase dispersion.

Using the basic principles just described, the next section delves into specific methods that generate and isolate signals from flowing material.

METHODS FOR ISOLATING FLOWING MATERIAL SIGNALS

Because signals from blood represent a small percentage of the total signal from the slice or volume, MR angiography requires that static material be eliminated from the image and therefore blood must at some moment be a source of signal to provide contrast.

The following sections describe subtraction methods that isolate the signal from flowing blood.

SUBTRACTION METHODS

The basic idea is to manipulate the appropriate imaging sequence parameter in such a way that two measurements are acquired with similar static material signals but dissimilar moving material signals in either phase or magnitude. The vessel image is based on the resultant difference signal. A variety of parameters exist that can be controlled to give different signals from non-moving and moving material. For example, spin-warp imaging uses gradients for slice-selection, phase-encoding, and read-out (frequency-encoding), all of which provide a vehicle for creating flow-sensitivity in addition to their customary functions. The mechanisms for producing a difference signal are phase-contrast and velocity dephasing/rephasing. These mechanisms rely on changes in the first moment of a particular magnetic gradient waveform to produce a difference from signal flowing material.

Figure 9:
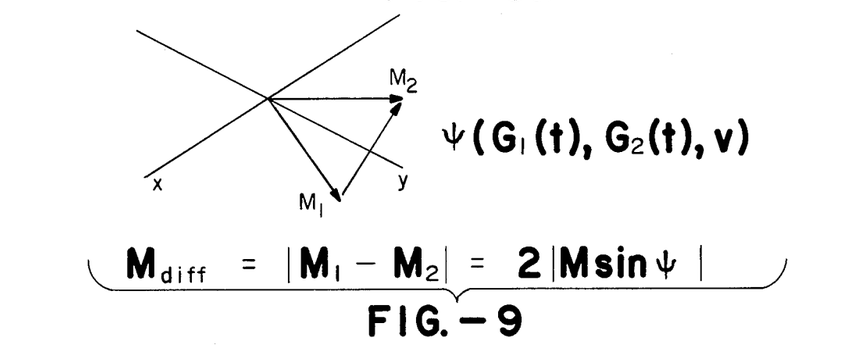
FIG. 9 illustrates a vector representation of signals from two images and illustrating phase subtraction.

When the range of velocity-dependent phase shifts is small enough over a volume element, signals related to phase differences can be obtained. FIG. 9 depicts by vectors the complex signal values from flowing material in two images based on gradients $G_1(t)$ and $G_2(t)$ respectively, where the difference in the vectors lies in phase and not in magnitude (amplitude). Numerous researchers have demonstrated this idea with bipolar readout gradients that give images whose complex pixel values depend on $e^{ikv}$ (k is some constant). The imaginary part of the reconstructed image represents contributions from only flowing material because of the phase shift. A phase-contrast image provides quantitative velocity information in addition to anatomical vessel information because phase is proportional to velocity. In principle, this method requires only one set of measurements if the phase of static material is relatively uniform over the image field. However, if the image is fraught by phase variations over the field, a temporal subtraction approach is desirable to cancel out these variations.

Figure 10:
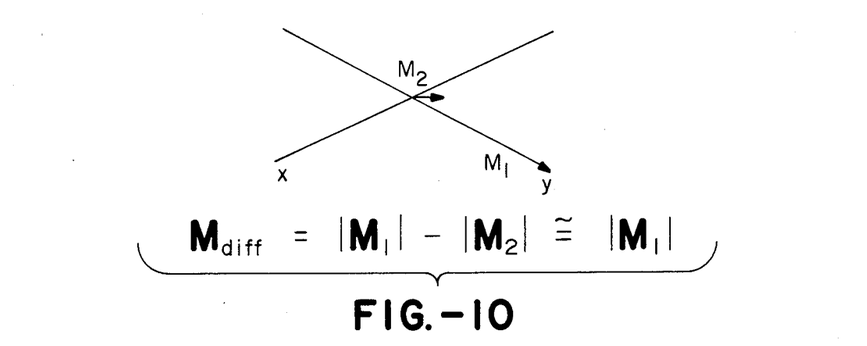
FIG. 10 illustrates a vector representation of signals from two images illustrating magnitude subtraction.

In the velocity dephasing/rephasing temporal subtraction approach, one image is based on reduced signals from blood due to velocity dephasing, the other image based on coherent signals due to velocity rephasing. FIG. 10 shows the effect on the two signal strengths and the resultant difference in magnitudes. One specific tactic takes advantage of the pulsatile nature of blood flow in many arteries wherein two measurements are derived from excitations applied at two separate moments of the heart cycle corresponding to different blood velocities. The subtraction operation removes the static material component, which is identical in each measurement, but leaves a signal dependent on the unequal response of flowing material moving at distinctive velocities. One demonstrated method gates during diastole when blood flow is relatively quiescent and during systole when flow is rapid. A bipolar read-out gradient is applied in the direction of flow so that signals from blood in the diastole image add coherently because blood is effectively static. In the systole image however, the blood signals add incoherently owing to the wide distribution of velocities arising from the large laminar flow distribution. The systole image acts as a "mask" image which allows static material to be cancelled from the diastole image.

The following sections describe new methods for subtraction angiography using slice-select, phase-encoding, and readout gradients.

SLICE-SELECT GRADIENT

Figure 11A:
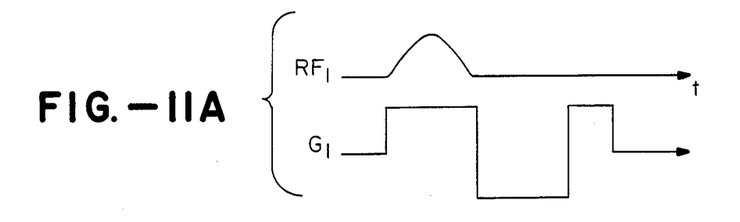
FIG. 11A illustrates a conventional selective excitation with RF pulse and accompanying slice-select gradient with refocusing interval.
Figure 11B:
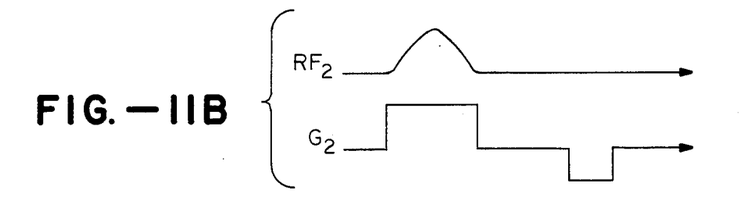
FIG. 11B illustrates a similar selective excitation but with added reversed bipolar segment to perform velocity rephasing.

In a selective (say 90°) excitation pulse (FIG. 11A), a bipolar gradient naturally arises from the gradient reversal necessary to rephase the spins over the slice. Flowing material emerges from the excitation sequence with a velocity-dependent phase shift which induces phase cancellations, as discussed in the previous section, if the field and velocity gradients are large enough. However, if the gradient takes the form of opposing bipolar gradients as shown in FIG. 11B, then both static and flowing material will become rephased, and a read-out gradient applied immediately thereafter yields the projection of the slice. Subtracting the magnitude of both projections thus cancels static material and leaves the rephased moving material.

Figure 12A:
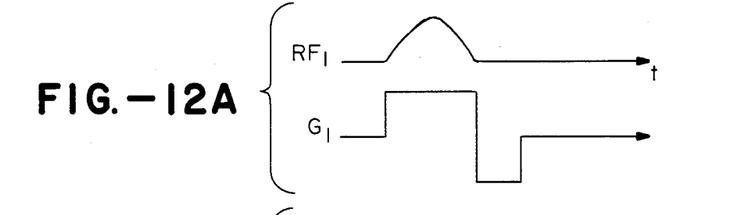
FIG. 12A illustrates a conventional selective excitation sequence.
Figure 12B:
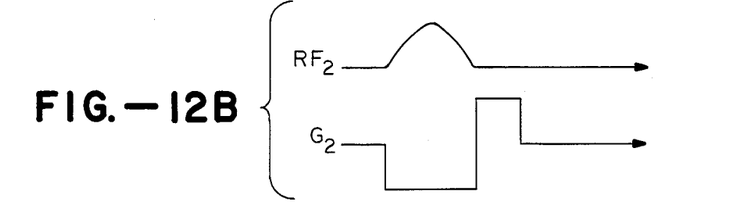
FIG. 12B illustrates a similar sequence but with slice-select gradient reversed to reverse the phase of flowing spins.

For relatively slow velocities where phase dispersion is not sufficiently wide to cause cancellations, an alternative slice-selection gradient scheme for subtraction imaging is illustrated by FIGS. 12A and 12B. By simply reversing the gradient between excitations, identical static signals arise but the velocity-dependent phase shift will be equal and opposite for moving material. As was shown in FIG. 9, the subtraction image is formed by taking the magnitude of the subtracted signals.

Figure 13A:
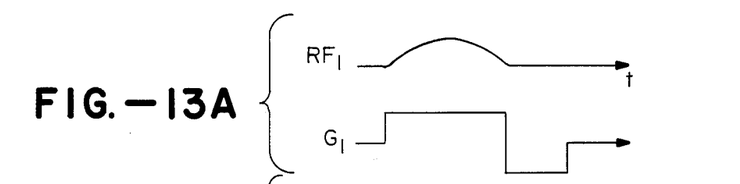
FIGS. 13A and 13B illustrate selective excitation sequences with different gradient amplitudes but the same time amplitude products during and after the RF pulse to excite static spins similarly but moving spins dissimilarly.
Figure 13B:
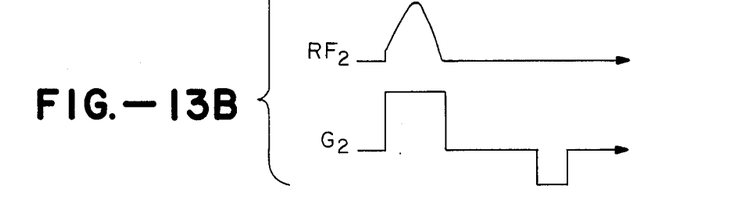

Other possible excitation schemes use two sequences with different gradient strengths but with the same gradient-pulsewidth product to maintain the same slice width (FIGS. 13A and 13B). The subsequent refocusing gradient interval can be varied to further differentiate the phase modulation of flow.

READ-OUT GRADIENT

As mentioned earlier, there have been several studies exploiting the naturally arising bipolar waveform of the readout gradient in imaging with (90°–180°) spin echoes. This velocity-dependent phase shift has been used for both phase-contrast imaging (slower flow rates) and coherent/incoherent difference imaging with pulsatile flow. One modification that provides a phase reference image and avoids reliance on pulsatile flow is to desensitize to flow altogether in one image by adding a reversed bipolar segment to the readout gradient.

Figure 14A:
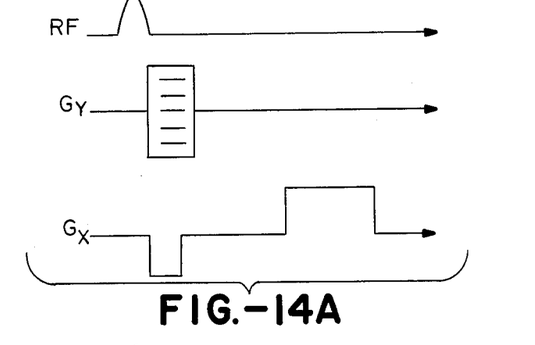
FIG. 14A illustrates a gradient-recalled echo sequence.
Figure 14B:
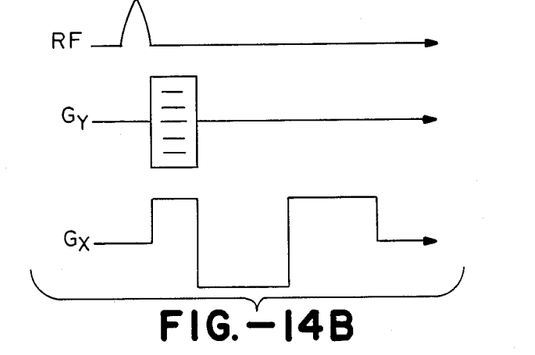
FIG. 14B illustrates a similar gradient-recalled echo sequence but with added reversed bipolar gradient segment to velocity rephase at the point of echo.

Another form of spin echoes are gradient-recalled echoes which avoid the 180° pulses and are used for fast imaging. Utilizing the same destructive interference mechanism to create the mask image, the readout gradient waveform of FIG. 14 produces a gradient-recalled echo and creates the appropriate phase dispersion, while the image with vessel signals comes from using a double bipolar gradient waveform, as seen in FIG. 14B, to desensitize from velocity. This method does not require gating if sufficient phase cancellation occurs with the minimum velocity encountered. However, in certain situations, gating offers advantages. Because this method does not require differences in velocity between the two sets of measurements, both sets can be taken at the same portion of the cardiac cycle, thereby minimizing motion artifacts from the subtraction step. This gating procedure can also be used with the 90°–180° spin echo sequences with the single and double bipolar gradient arrangement.

Figure 15:
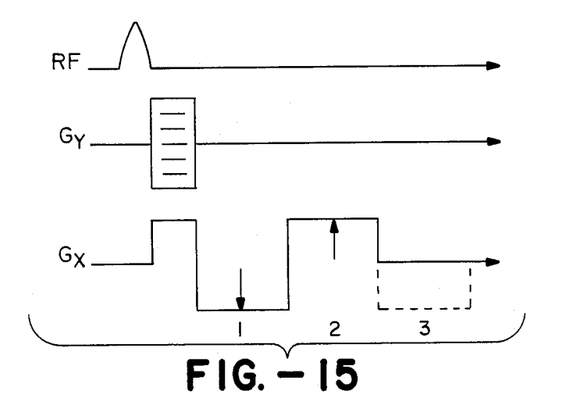
FIG. 15 illustrates the acquisition of both temporal subtraction measurements with gradient recalled echoes after excitation.

Another alternative is to read out both measurements after the same excitation by employing multiple echo formation as with the gradient waveform of FIG. 15.

Such a triple-segment waveform makes available both the velocity-dephased-measurement (first gradient-recalled echo) and velocity-rephased measurement (second echo). Subtracting the magnitude images eliminates the static tissue if negligible relaxation occurs between the first and second echo; otherwise, an image based on a third gradient-recalled echo can be acquired to provide the amplitude adjustments for the first two images. If errors due to chemical shift and field inhomogeneities are significant, multiple echo formation with 180° pulses can be used. Because both measurements are derived from the same excitation, this method possesses greater motion immunity and allows faster imaging than those methods involving separate excitations for the two measurements.

PHASE-ENCODING GRADIENT

The effect of phase-encoding gradients in spin-warp imaging is to create a physical shift of the moving material in the image. For a variable amplitude phase-encoding gradient of constant duration $\tau_y$, the resultant phase for a spin initially at $y_o$ and moving with y-velocity v is $$\phi = \gamma G \left( y_o \tau_y + v \frac{\tau_y^2}{2} \right). \tag{15}$$

Because $\tau_y$ is fixed and G is variable, the phase-encoding is identical to that of a static spin whose phase is $$\phi = \gamma G y_o' \tau_y, \tag{16}$$

where $y_o' = y_o + v\tau_y/2$. The equivalence implies that the effect of the phase-encoding gradient is to displace the moving spins in the image by an amount $v\tau_y/2$ in the phase-encoding direction.

For flow along both the phase-encoding ($v_y$) and readout ($v_x$) directions, a spin at position ($x_o, y_o$) at the start of phase-encoding gets imaged at ($x_o', y_o'$), where $x_o'$ is the spin's x-position at the echo time. Hence the x-displacement, $x_o' - x_o$, equals $v_x T_i$, where $T_i$ is the time from the start of phase-encoding to the spin-echo, but the y-displacement, $y_o' - y_o$ ($v_y \tau_y / 2$ in the above example), depends on the phase-encoding waveform. Because $x_o'$ varies independently of $y_o'$, the position ($x_o', y_o'$) does not in general lie on the trajectory of the spin. For long $T_i$, $v_x T_i$ can be large compared with $v_y \tau_y / 2$, implying that ($x_o', y_o'$) is displaced mainly in the x-direction with respect to the flow trajectory. Collectively, the image of such spins is a vessel shifted in the x-direction with blurring from velocity-dependent shifts if a distribution of velocities is present. This overall shift can be removed if $y_o'$ is made to correspond to the spin position at the time of the echo as with $x_o'$. For straight flow, this is done by using a phase-encoding gradient as in FIG. 5 with a first moment that makes $$\phi = \gamma G(y_o + v_y T_i)\tau_y. \tag{17}$$

Because ($x_o', y_o'$) of each spin lies on its trajectory, the collection of flowing spins gives an unshifted vessel image. Similarly, a gradient waveform that avoids both velocity and acceleration effects (FIG. 6) can be utilized for phase-encoding to avoid shifts or distortions from higher order motion.

To do subtraction imaging, the phase-encoding gradient can be designed to bring about phase cancellation over the line of projection as in the readout gradient case. By adding a fixed zero-area bipolar waveform with amplitude $G_1$ and duration $\tau_1$ to the customary phase-encoding waveform, the resultant phase becomes $$\phi = \gamma G \left( y_o \tau_y + v_y \frac{\tau_y^2}{2} \right) - \gamma G_1 v_y \frac{\tau_1^2}{4}. \tag{18}$$

Unlike in the readout case where the bipolar gradient serves a dual function, this $G_1$ bipolar gradient is purely auxiliary and can be varied from one phase-encoding to the next. Because the "running" variable in the phase-encoding direction is G, the primary effect on the signals (assuming constant v for all phase-encodings) is determined by examining the "echo" condition or when G=0. The remaining term in the phase expression relates to the bipolar waveform and allows for the phase cancellation to form the mask image. If the running variable is $\tau_y$ (with fixed $|G|$), then in the phase-encoding scheme expressed by equation (18), the response of the resultant velocity-dependent reconstruction changes but phase cancellation continue to depend on $G_1$.

To form the mask image reliably, $G_1$ must be large enough to create sufficient dephasing for the minimum velocity gradient expected; otherwise, gating might be required to ensure large enough velocity gradients. If however the vessel is oriented in the phase-encoding direction, its spatial-frequency response lied predominantly in the low frequency region. Therefore, the most important phase-encodings to maintain consistency in the set of projections are the ones occupying the lower spatial frequencies.

PROJECTION IMAGING

For this discussion, a 2-D projection image consists of pixels representing line integrals along some direction through the volume. With MR, it is also possible by selective excitation methods to do projection imaging over a limited slab as opposed to a thin slice or the entire volume. This feature may be useful to avoid outerlying undesired flowing material that can create confusing signals in the image. Different gradient waveforms used for each of the following imaging methods influence the type of flow-sensitive methods that can be incorporated.

THICK-SLICE (SLAB) SPIN-WARP IMAGING

Conventional spin-warp (2-D Fourier transform) imaging can perform projection imaging by using non-selective or mildly selective excitations. If z is the customary slice-select direction, and x and y correspond to the readout and phase-encoding directions, then each pixel relates to the line integral along z. Although the entire sequence of measurements must be acquired before any part of the image can be reconstructed, there are means of reducing the number of measurements by restricting the field-of-view. In a "strip-scan" procedure, selective 90° and 180° pulses in a spin-echo sequence define an active region represented by the intersection of the slices selected by the two pulses. The 90° pulse initially defines a slice perpendicular to z, then the 180° pulse restricts the field-of-view to a strip perpendicular to y, the phase-encoding direction, hence reducing the number of required phase-encodings. Another way to reduce the number of phase-encodings is to excite a moderately thin slab with a z slice-select gradient and then phase-encode in the same z direction to gain good z resolution and give line integrals along y (assuming x is the readout direction). A multi-slab procedure (analogous to multi-slice imaging) results in pseudo line-scan (slab-scan) imaging—one level of z resolution from the slab definition, the second level of z resolution from phase-encoding. Flow-sensitizing methods involving phase-encoding and readout gradients are applicable to all these imaging methods. In addition, slice-select techniques can be used with the methods that restrict the field-of-view with the appropriate selective excitations.

LINE-SCAN IMAGING

This method builds a projection image in a line by line fashion, each line obtained by selectively exciting a thin slice and recording its 1-D projection with a readout gradient. After the signal from a particular slice is recorded, the projection from the next slice can be gathered immediately. Hence, an image can be formed very rapidly, in a matter of seconds, with a field-of-view dependent on the number of lines collected, and with resolution in one dimension dependent now on the slice width of the selective excitation. Because of the focal plane shutter effect, motion during the acquisition interval results in only geometric distortion. This imaging method can incorporate those flow-sensitive methods relying on slice-select gradients or readout gradients.

SUMMARY

The preceding description presents several methods that manipulate imaging gradients, excitation parameters, or timing to create an image of flowing blood only. An assortment of projection imaging methods that can be suitably combined with the various signal-generating methods has also been discussed.

A key concept underlying many of the subtraction methods is that gradients create variable flow sensitivity (in phase or magnitude) while maintaining their imaging functions. Some methods rely on velocity changes occurring with pulsatile flow and require gating (typically to systole and diastole), while other methods rely on changes in imaging parameters and not on velocity changes for the basis of the difference signal. The latter methods are more flexible as they may use gating to the same portion of the cardiac cycle to minimize motion effects, or they may continue to use pulsatile flow to their advantage, or they may be applied in constant flow regions with fast imaging sequences. Because projection imaging gives the line integral across the vessel lumen, the velocity distribution over the lumen significantly impacts the resultant flow signal. Whereas uniform flow results in a coherent signal at a particular phase, laminar or general nonuniform flow can lead to a reduced signal due to phase cancellations. Hence with nonuniform flow, velocity phase shifts lead to dephasing and a loss of signal amplitude as compared with uniform flow or velocity rephased signals. The velocity dephasing/rephasing subtraction methods sensitize to velocity to eliminate flow signals and desensitize to velocity to create flow signals which remain in the subtraction image.

For projection imaging, thick slice spin warp imaging, which indirectly measures the line integrals by sequencing through a set of measurements, is well established and employs gradients easily amenable to flow sensitization. Methods that more directly measure the line integrals such as line-scan are far less established but offer significantly reduced imaging times which can be important in imaging certain vascular regions such as the coronary arteries.

There has been described a new and improved method of magnetic resonance angiography by selectively employing magnetic field gradients during nuclear spin excitation and signal detection to selectively remove stationary material and moving material from an image. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of selectively projection imaging material using magnetic resonance techniques comprising the steps of
   obtaining first image data signals of a body using a first gradient field, the waveform of said first gradient field having a first moment of a first non-zero value,
   obtaining second image data signals of said body using a second gradient field, the waveform of said second gradient field having a first moment value different from said first non-zero value, and
   subtracting said first image data signals from said second image data signals wherein said first and second image data signals are vectors and the resultant signal is dependent on the phase and amplitude of said image data signals.

2. The method as defined by claim 1 wherein said first gradient field and said second gradient field are applied in a direction of flowing material within static material said step of subtracting first image data signals from said second image data signals eliminating signals from static material and providing a net signal attributable to said flowing material.

3. The method as defined by claim 2 wherein said first moment value of said second gradient field waveform is zero.

4. The method as defined by claim 2 wherein said first moment value of said second gradient field waveform is non-zero.

5. The method as defined by claim 2 wherein said first gradient field and said second gradient field are applied during slice select excitation of nuclear spins in said body.

6. The method as defined by claim 2 wherein said first gradient field and said second gradient field are applied as preparatory fields after slice select excitation and before signal readout.

7. The method as defined by claim 2 wherein said first gradient field and said second gradient field are applied for readout of nuclear spin signals.

8. Apparatus for selectively projection imaging moving material using magnetic resonance techniques comprising
   first means for establishing a first magnetic field including a first magnetic gradient field for image/slice selection,
   second means for exciting nuclear spins in a selected image slice,
   third means for applying a second magnetic gradient following excitation of nuclear spins and a third magnetic gradient during detection of nuclear spin signals, means for detecting nuclear spin signals during a readout period, fourth means for subtracting first nuclear spin signals from second nuclear spin signals, said first and second nuclear spin signals resulting from the application of magnetic gradients whose waveforms have different first moments, wherein said first and second nuclear spin signals are vectors and the resultant signal is dependent on the phase and amplitude of said nuclear spin signals, and means for imaging the difference in said nuclear spin signals to provide a projection image of moving material.

9. Appatus as defined by claim 8 wherein the selectively imaged material is blood flow, said magnetic gradients whose waveforms have different first moments are applied in a direction of a velocity component of said blood flow.

10. Apparatus as defined by claim 9 wherein said first magnetic gradient waveform has different first moments for two signal detection sequences.

11. Apparatus as defined by claim 9 wherein said second magnetic gradient waveform has different first moments for two different detection sequences during which said first nuclear spin signals and said second nuclear spin signals are detected.

12. Apparatus as defined by claim 9 wherein said third magnetic gradient has different moments for two signal detection sequences during which said first nuclear spin signals and said second nuclear spin signals are detected.

13. Apparatus as defined by claim 8 wherein the phases of said first and second detected nuclear spins for moving material are different due to differences in said first moments.

14. Apparatus for selectively projection imaging moving material using magnetic resonance techniques comprising first means for establishing a first magnetic field including a first magnetic gradient field for image/-slice selection, second means for exciting nuclear spins in a selected image slice, third means for applying a second magnetic gradient following excitation of nuclear spins and a third magnetic gradient during detection of nuclear spin signals, means for detecting nuclear spin signals during a readout period, fourth means for obtaining first image signals from a first sequence of first nuclear spin signals and second image signals from a second sequence of second nuclear spin signals, and fifth means for subtracting the amplitudes of said first image signals from the amplitudes of said second image signals to obtain image signals of moving material, said first and second nuclear spin signals resulting from the application of magnetic gradients whose waveforms have different first moments, and means for imaging the difference in said nuclear spin signals to provide a projection image of moving material.

15. Apparatus as defined by claim 14 wherein a gradient waveform used in obtaining said first image signals has a first moment of approximately zero value.

16. A method of selectively projection-imaging material using magnetic resonance techniques comprising the steps of obtaining first image data signals of a body using a first gradient field, the waveform of said first gradient field having a first moment of a first non-zero value, obtaining second image data signals of said body using a second gradient field, the waveform of said second gradient field having a first moment value different from said first non-zero value, and subtracting the amplitude of said first image data signals from the amplitude of said second image data signals.

* * * * *